(12) United States Patent
Schneider et al.

(10) Patent No.: US 6,697,279 B2
(45) Date of Patent: Feb. 24, 2004

(54) FERROELECTRIC READ/WRITE MEMORY WITH SERIES-CONNECTED MEMORY CELLS (CFRAM)

(75) Inventors: Ronny Schneider, Sprötau (DE); Georg Braun, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/758,300

(22) Filed: Jan. 10, 2001

(65) Prior Publication Data

US 2001/0015906 A1 Aug. 23, 2001

Related U.S. Application Data

(63) Continuation of application No. PCT/DE99/01931, filed on Jul. 1, 1999.

(30) Foreign Application Priority Data

Jul. 10, 1998 (DE) ......................................... 198 30 963

(51) Int. Cl.[7] ............................................... G11C 11/22
(52) U.S. Cl. ................... 365/145; 365/149; 365/185.01
(58) Field of Search ................................ 365/145, 149, 365/189.01

(56) References Cited

U.S. PATENT DOCUMENTS

| 5,892,728 | A | * | 4/1999 | Allen et al. | 365/230.06 |
| 5,898,609 | A | * | 4/1999 | Yoo | 365/145 |
| 5,903,492 | A | * | 5/1999 | Takashima | 365/145 |
| 6,320,782 | B1 | * | 11/2001 | Takashima | 365/145 |

FOREIGN PATENT DOCUMENTS

DE 197 24 449 A1 12/1997

* cited by examiner

*Primary Examiner*—David Nelms
*Assistant Examiner*—Connie C. Yoha
(74) *Attorney, Agent, or Firm*—Laurence A. Greenberg; Werner H. Stemer; Ralph E. Locher

(57) ABSTRACT

The memory device has series-connected ferroelectric memory cells in which a series circuit composed of a resistor and/or of a transistor for the ferroelectric capacitor of a respective memory cell is present. As a result, without unacceptably increasing the access time, the interference pulses at the ferroelectric capacitors of the memory cells which are not being addressed at that particular time and which are generated by the reading out or writing of the addressed memory cell are reduced in such a way that they have virtually no further influence on the non-addressed memory cells.

4 Claims, 4 Drawing Sheets

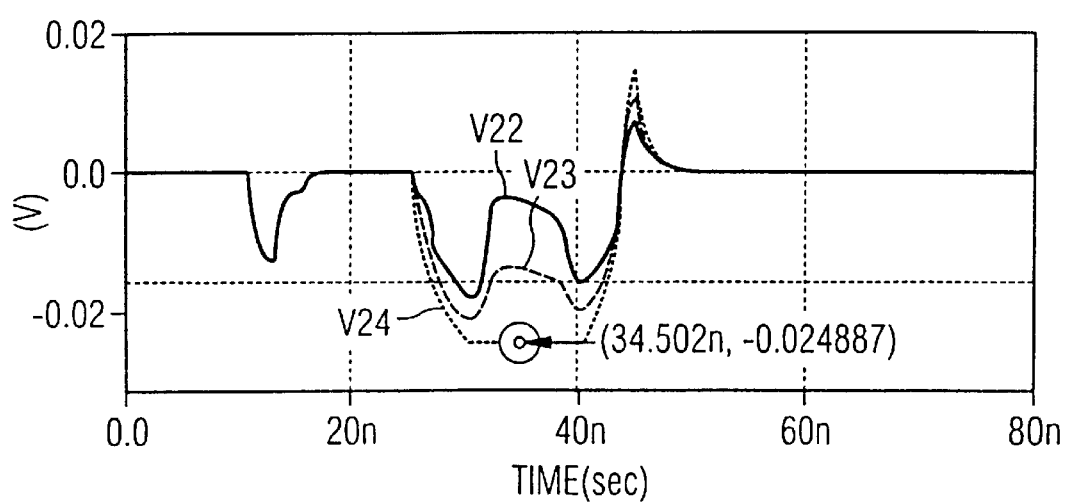

FERROELECTRIC READ/WRITE MEMORY WITH SERIES-CONNECTED MEMORY CELLS (CFRAM)

CROSS-REFERENCE TO RELATED APPLICATION

This application is a continuation of copending International Application No. PCT/DE99/01931, filed Jul. 1, 1999, which designated the United States.

BACKGROUND OF THE INVENTION

1. Field of the Invention

The invention lies in the field of memory devices and pertains, more specifically, to a read/write memory which has one ferroelectric capacitor and at least one transistor per memory cell. In ferroelectric memories, the remanence of the electric polarization of the dielectric is used to store two logic states. When this is done, different effects occur which influence the polarization of other cells on the same bit or word line. It is thereby possible that the stored information of those cells is destroyed. If there are no fixed potentials present in a polarized capacitor, due to leakage current to the substrate, a voltage builds up which is possibly in the opposite direction to the polarization. It is therefore necessary to keep both sides of the capacitor as far as possible at the same potential if that capacitor has not been read out or written to.

The Digest of Technical Papers from the Symposium on VLSI Circuits 1997, pages 83 and 84, discloses a ferroelectric memory in which a plurality of memory cells or ferroelectric capacitors are connected in series and the respective capacitors can be short-circuited by one associated transistor each. This ensures that both the electrodes of a ferroelectric capacitor are kept at the same potential which, if not read or written to, is even constant. If a cell is written to or read, the corresponding transistor is switched off. In addition, the bit line has applied to it a voltage which differs significantly from the voltage on the capacitor plate which cannot be connected to the bit line. The difference between the two voltages has the effect of charging to saturation the ferroelectric capacitor. All other transistors in a respective series circuit composed of memory cells and/or in a respectively selected memory cell block remain conductive during this time, ensuring that the charge current or discharge current across the selected cell capacitor can flow via the transistors which are short-circuiting the remaining capacitors of a memory cell block. However, a voltage which is also applied to the associated ferroelectric capacitor, and which favors or attenuates polarization depending on the polarization of the ferroelectric capacitor and according to the direction of the charge current or discharge current drops as a result of the on resistance of the switched-on transistors. In the case of attenuation, those voltage drops are manifest as interference pulses which, given sufficient amplitude and/or frequency, change the polarization to such an extent that the stored information of the ferroelectric capacitor is destroyed. A series circuit comprised of the greatest possible number of such ferroelectric memory cells increases the overall resistance of the current path and reduces the level of the current, as a result of which the undesired interference pulses at the ferroelectric capacitors of the non-selected memory cells are also reduced. However, this has the disadvantage that the charging and discharging process of the ferroelectric capacitor which is being read and written to is significantly prolonged. For this reason, in the prior art disclosed above, a plurality of memory cell blocks, with series circuits composed of, for example, 16 individual cells, are provided. The disadvantage there is that the interference pulses are often unacceptably high and a data loss occurs because the on resistance of the transistors cannot be reduced as desired owing to the very large transistor width or very high charge carrier mobility which this requires.

SUMMARY OF THE INVENTION

The object of the present invention is to provide a ferroelectric read/write memory which has memory cells connected in series and which overcomes the above-noted deficiencies and disadvantages of the prior art devices and methods of this general kind, and in which both interference voltages at ferroelectric capacitors of non-selected memories and the expenditure in terms of circuitry are kept as low as possible.

With the above and other objects in view there is provided, in accordance with the invention, a ferroelectric read/write memory with a plurality of memory cells connected in series:

the memory cells have a respective ferroelectric capacitor, a respective resistor, and a transistor with a gate connected to a word line;

the resistor and the ferroelectric capacitor of a memory cell are connected in series forming a series circuit; and the transistor is connected in parallel with the series circuit containing the ferroelectric capacitor and the resistor and is driven via a signal on the word line connected to its gate.

In accordance with an added feature of the invention, the resistor is replaced with a further transistor having a conductivity depending on the signal of the word line.

In accordance with a concomitant feature of the invention, a control unit is connected to the memory cells, the control unit switching on the further transistor in a memory cell selected via the signal of the respective word line as a function of the signal, and driving all other further transistors of the non-selected memory cells to just before their switch-off threshold.

In other words, according to the invention, the series circuit containing the ferroelectric capacitor and the resistor are connectible in low-impedance fashion via the respective transistor as a function of a signal of a respective word line connected to the gate of the respective the transistor.

Other features which are considered as characteristic for the invention are set forth in the appended claims.

Although the invention is illustrated and described herein as embodied in a ferroelectric read/write memory with memory cells (CFRAM) connected in series., it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 5 is a timing diagram of the interference voltage in a memory according to FIG. 2.

DESCRIPTION OF THE PREFERRED EMBODIMENTS

The invention may be summarized with the feature that a resistor or a specifically driven transistor is connected in series with the ferroelectric capacitor of a respective memory cell. In this way interference pulses which are generated by the reading out of the respective addressed memory cell at ferroelectric capacitors of memory cells which are not addressed at that particular time are reduced or eliminated, and the access time is not increased unacceptably.

Figure 1:
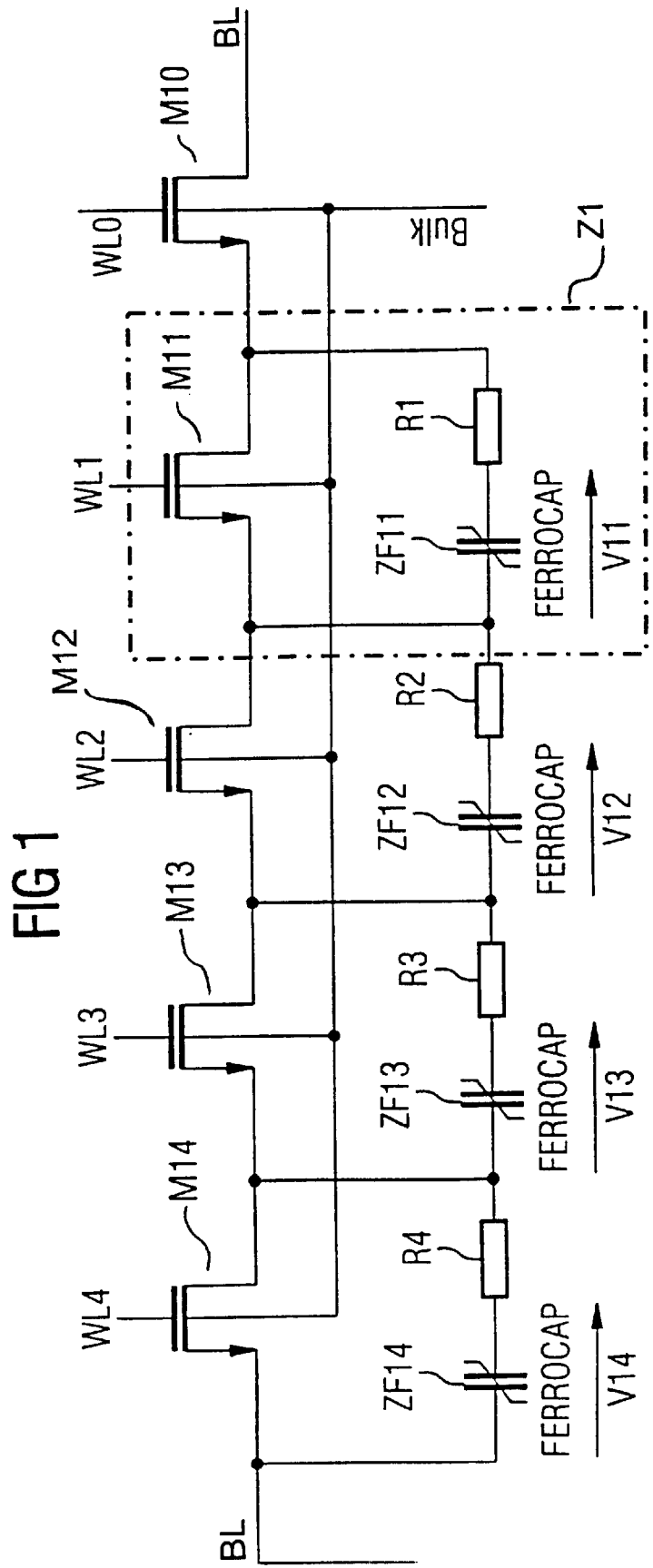
FIG. 1 is a schematic diagram of a first exemplary embodiment of the ferroelectric read/write memory according to the invention.

Referring now to the figures of the drawing in detail and first, particularly, to FIG. 1 thereof, there is seen a first exemplary embodiment in the form of a memory block with four ferroelectric memory cells connected in series. It is possible to connect the series circuit composed of the four memory cells to a bit line BL by means of a selection transistor M10. The selection transistor M10 can be driven via a word line WL0. All four memory cells connected in series are constructed in the same way as, for example, a first memory cell Z1. The cell Z1 has a ferroelectric capacitor ZF11 and a resistor R1 which is connected in series thereto. A transistor M11 is connected in parallel with this series circuit ZF11-R1 and its gate is connected to a word line WL1. Correspondingly, further ferroelectric capacitors ZF12 . . . ZF14, further resistors R2 . . . R4 and further transistors M12 . . . M14 are provided in the other three cells, wired and can be driven via further word lines WL2 . . . WL4. The bit line BL can be connected by means of the selection transistor M10 and the series circuit composed of the transistors M11 . . . M14 to a node PL which typically has a voltage level of approximately VDD/2. The transistors M10 . . . M14 advantageously have a common substrate terminal bulk.

A cell of a selected block can be read out onto the bit line BL by means of a corresponding signal on the word line WL0. If, for example, the cell Z1 is read out, the word lines WL2 . . . WL4 receive a corresponding signal indicating that the transistors M12 . . . M14 are switched on and the non-selected cells, that is to say in this case the respective series circuits composed of the ferroelectric capacitors and resistors are bypassed by these transistors and the transistor M11 is driven by a signal on the word line WL1 to the extent that it switches off. This has the effect of connecting the bit line BL to the voltage level PL by means of the selection transistor M10 via the resistor R1 and the ferroelectric capacitor Z11 and via the transistors M12 . . . M14 which are switched on. The voltage drops caused by the on resistances of the transistors M12 . . . M14 occur in each case across the series circuit composed of the respective ferroelectric capacitor and the associated resistor, for example ZF12 and R2, as a result of which the interference voltages V12 . . . V14 across the actual ferroelectric capacitors ZF12 . . . ZF14 are significantly reduced in comparison with the prior art owing to the read current of the cell Z1.

Figure 2:
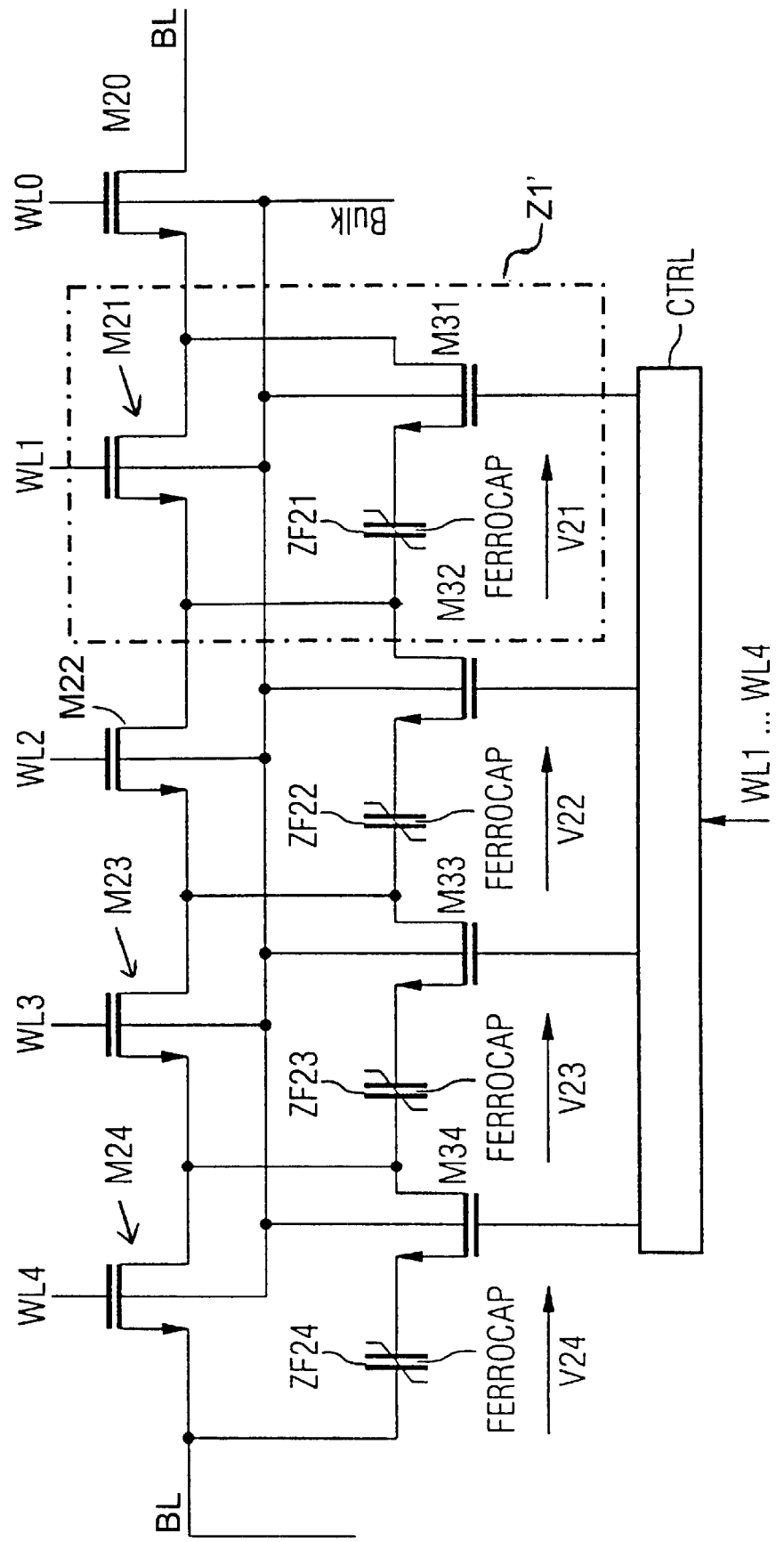
FIG. 2 is a schematic diagram of a second exemplary embodiment of a ferroelectric read/write memory according to the invention.

Referring now to FIG. 2, there is shown a further exemplary embodiment of the invention which differs essentially from the exemplary embodiment illustrated in FIG. 1 in that the resistors R1 . . . R4 connected in series with the ferroelectric capacitors are replaced by further transistors M31 . . . M34 whose gate terminals can be driven by means of a control device CTRL as a function of the signals on the word lines WL1 . . . WL4. Instead of the cell Z1 which is connected to the bit line via the transistor M10, a cell Z1' is provided here, and it is connected via a transistor M20 to the bit line and its ferroelectric capacitor ZF21 is connected in series with the transistor M31, and this series circuit can be bypassed by means of a transistor M21. In a corresponding way, the transistors M12 . . . M14 from FIG. 1 are designated in FIG. 2 by M22 . . . M24, and the capacitors ZF12 . . . ZF14 from FIG. 1 by ZF22 . . . ZF24 in FIG. 2. Furthermore, the interference voltages V22 . . . V24 are applied across the ferroelectric capacitors ZF22 . . . ZF24.

The substrate terminals of all the transistors are advantageously connected to a common terminal bulk here.

The mode of operation is similar to that in the circuit configuration in FIG. 1. The transistor, for example transistor M31, which is connected in series with the capacitor of the selected cell using the control unit CTRL, being switched on and the transistors, for example the transistors M32 . . . M34 which are connected in series with the capacitors of the non-selected cells being driven by the unit CTRL to just before their switch-off threshold.

If the transistors, for example the transistors M32 . . . M34 which are connected in series with the capacitors of the non-selected cells were switched off entirely, the interference pulses would be greater than in the case of transistors which are not quite switched off because the diffusion capacitances, the gate/source capacitances and the drain/source capacitances of these transistors would form capacitive voltage splitters with the ferroelectric capacitors.

Figure 3:
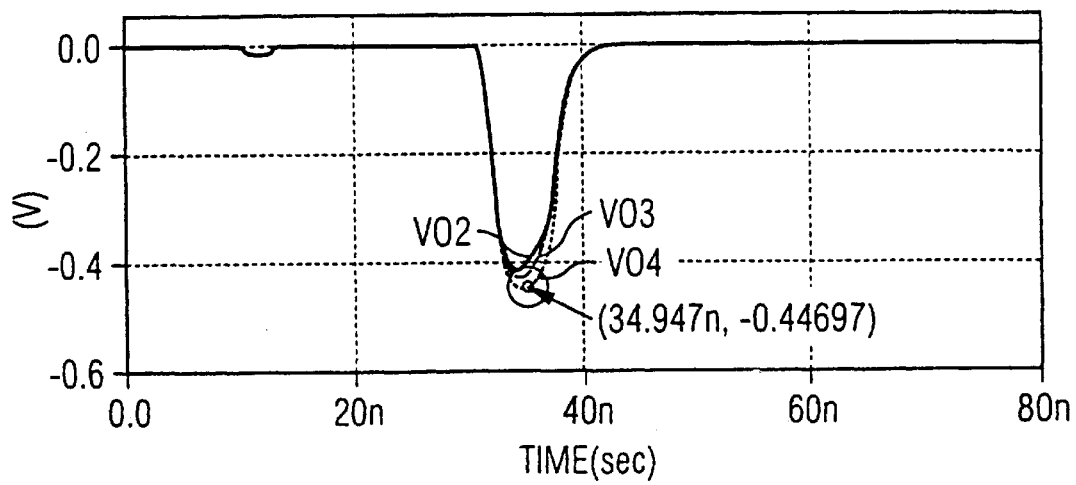
FIG. 3 is a timing diagram of the interference voltage in a prior art memory cell.

In FIG. 3, interference voltages V02 . . . V04 are given in a diagram for the known case in which the ferroelectric capacitors are connected directly parallel to the respective transistor without a resistor or transistor which is respectively connected in series. The interference voltage levels are, for example, approximately −0.4 volts here, which is already of the order of magnitude of the coercitive voltage of customary ferroelectric capacitors.

Figure 4:
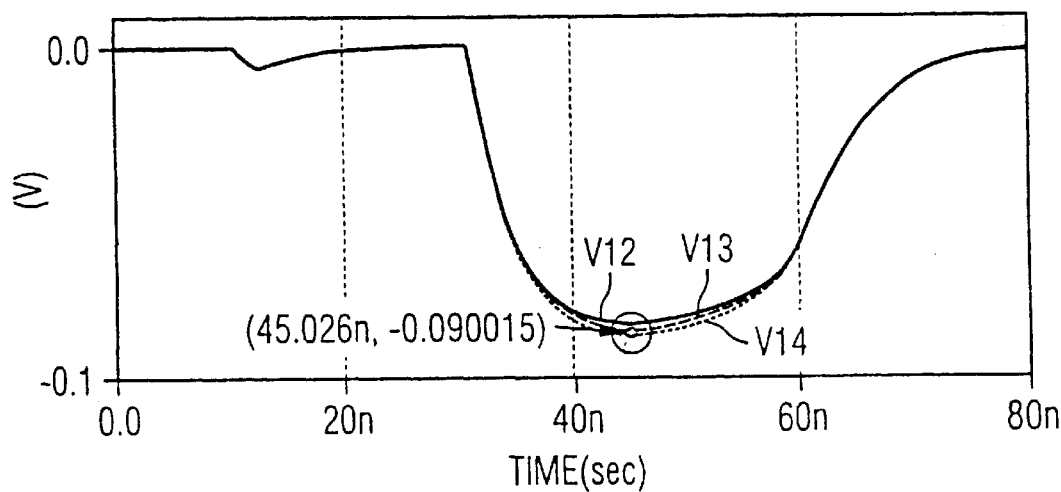
FIG. 4 is a timing diagram of the interference voltage in a memory according to FIG. 1.

In FIG. 4, the interference voltages V12 . . . V14 at the ferroelectric capacitors ZF12 . . . ZF14 of non-selected memory cells are shown in a timing diagram, the resistors R1 . . . R4 being, for example, of the order of magnitude of 100 kΩ in FIG. 1. The interference voltages V12 . . . V14 each have a value less than −0.1 volts which is significantly less than the coercitive voltage in customary ferroelectric capacitors.

For a ferroelectric memory according to FIG. 2, that is to say with transistors which are respectively connected in series with the ferroelectric capacitors, the interference voltages V22 . . . V24 at the ferroelectric capacitors of the non-selected memory cells are shown in FIG. 5, the values of the interference voltages being once more considerably smaller than in the case of a memory with the resistors which are connected in series with the ferroelectric capacitors, the time loss in the access time being insignificantly worse than with prior art ferroelectric memories of this type.

We claim:

1. A ferroelectric read/write memory, comprising:
   a plurality of memory cells connected in series;
   said memory cells each having only one ferroelectric capacitor, a resistor, and a transistor having a gate connected to a word line;
   said resistor and said ferroelectric capacitor being connected in series forming a series circuit; and said transistor being connected in parallel with said series circuit containing said ferroelectric capacitor and said resistor and being driven via a signal on the word line connected to said gate.

2. The ferroelectric read/write memory according to claim 1, wherein said resistor is a further transistor having a conductivity depending on the signal of the word line.

3. The ferroelectric read/write memory according to claim 2, which comprises a control unit connected to said memory cells, said control unit switching on said further transistor in a memory cell selected via the signal of the respective word line as a function of the signal, and driving all other further transistors of the non-selected memory cells to just before their switch-off threshold.

4. A ferroelectric read/write memory, comprising:

a plurality of memory cells connected in series;

said memory cells each having only one ferroelectric capacitor, a resistor, and a transistor having a gate connected to a word line;

said resistor and said ferroelectric capacitor being connected in series forming a series circuit; and said series circuit containing said ferroelectric capacitor and said resistor being connectible in low-impedance fashion via said respective transistor as a function of a signal of a respective word line connected to said gate of the respective said transistor.

* * * * *